United States Patent [19]
Ziegler, Jr. et al.

[11] Patent Number: 5,563,817
[45] Date of Patent: Oct. 8, 1996

[54] ADAPTIVE CANCELLER FILTER MODULE

[75] Inventors: Eldon W. Ziegler, Jr., Clarksville; Paul Friedlander, Owings Mills, both of Md.; Jeffrey N. Denenberg, Trumbull, Conn.

[73] Assignee: Noise Cancellation Technologies, Inc., Linthicum, Md.

[21] Appl. No.: 367,285

[22] PCT Filed: Jul. 14, 1992

[86] PCT No.: PCT/US92/05770

§ 371 Date: Jan. 13, 1995

§ 102(e) Date: Jan. 13, 1995

[87] PCT Pub. No.: WO94/01827

PCT Pub. Date: Jan. 20, 1994

[51] Int. Cl.⁶ .................................................. G06F 15/31
[52] U.S. Cl. ........................................................ 364/724.19
[58] Field of Search ........................ 364/724.19, 724.01; 381/71

Primary Examiner—Tan V. Mai
Attorney, Agent, or Firm—Crowell & Moring

[57] ABSTRACT

An adaptive canceller filter module having signal sensors and signal filters in a circuit for use with filtered-x algorithms to adapt the coefficients of one of said filters to minimize the measure of the error.

10 Claims, 5 Drawing Sheets

EQUATIONS
est = $\overline{Noise} \cdot \overline{C}$
err = sen − est
$\overline{C+} = a\, err\, \overline{Noise}$

ADAPTIVE CANCELLER FILTER MODULE

This invention is concerned with an LMS filter chip that can be used as a building block in low cost noise cancellation applications.

SUMMARY OF THE INVENTION

Prior art adaptive canceller filters have consisted of software code in digital computers, often in digital signal processor (DSP) microprocessors such as the TMS320C25 by Texas Instrument or as discrete hardware components in analog systems. The software—DSP methods lack speed while the analog methods contain an excess of parts and lack adaptability.

INMOS has produced a multiply-accumulate chip, the IMS A100, that can be used to implement digital filters but no method is provided for adaptation of the filter coefficients.

The current invention overcomes the prior an limitations while providing a standard adaptive filter module that can operate at high speed, reduces hardware parts count and will lead to reduced cost from volume production.

It works with the Digital Virtual Earth (DVE) algorithm and the AFF algorithm which achieves noise cancellation without requiring either a noise reference or a sync signal as described in U.S. Pat. No. 5,105,377 which is hereby incorporated by reference herein. It also works with the Filtered-x class of algorithms which utilize a reference signal and adapt an FIR filter to minimize the power of an error signal.

Accordingly, it is an object of this invention to provide a standard adaptive filter module for FIR or IIR filters that can operate at high speed.

Another object is to provide the architecture for a filtered-x adaptive filter module.

A still further object of this invention is to provide an adaptive filter module that will reduce the amount of hardware in active noise cancellation apparatus.

Furthermore, it is an object of this invention to provide a novel filtered -x adaptive filter for enhancing the operation of the digital virtual earth (DVE) algorithm.

These and other objects of this invention will become apparent when reference is had to the accompanying description and drawings.

The DVE algorithm/Filtered-X Algorithm

Description

The Digital Virtual Earth (DVE) algorithm holds the promise of a generic solution to active cancellation without requiring either a noise reference or a sync signal. To date it has shown promise in applications which have either a relatively stationary noise signature or a simple noise spectrum.

Figure 1:
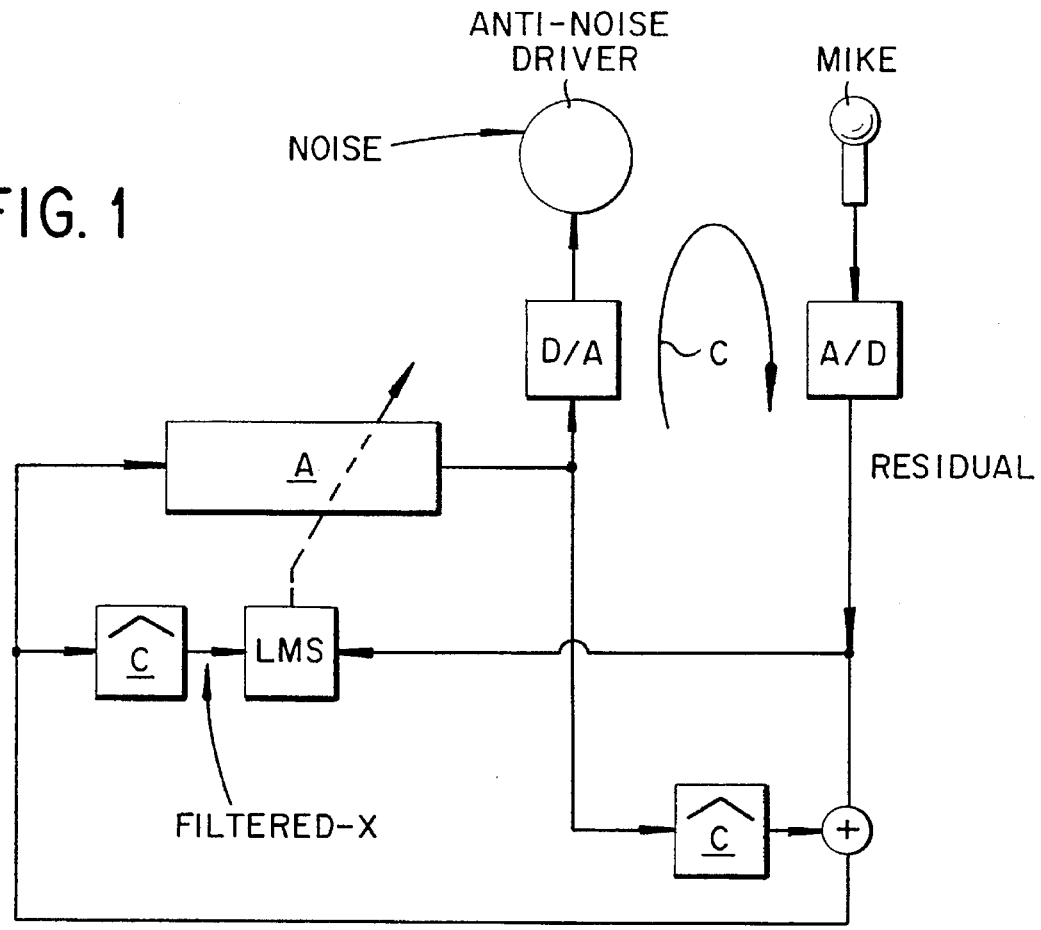
FIG. 1 is a simplified block diagram of the DVE algorithm.

DVE works by first estimating the original noise from the measurement of the residual and knowledge of its anti-noise output as modified by the system transfer function "C". This estimated noise is passed through an adaptive filter to then produce the anti-noise. The Filtered-X LMS adaptation of the filter then minimizes the residual signal power. FIG. 1 shows a simplified block diagram of the DVE algorithm where "C"—is the system transfer function, that is, the system's effect on the anti-noise as it flows through the D/A (and its reconstruction filter), through the anti-noise driver to the residual microphone, through the A/D (and its anti-aliasing filter).

"$\hat{C}$" —An estimate of "C" established by "calibration" and copies into two physical filters Filtered-X: This filter makes certain that the LMS updates are done using consistent measures. The reference signal (X—the estimated noise signal) is passed through a copy of "$\hat{C}$" since the anti-noise signal has gone through the real "C"

Anti-Noise: This filter is used to estimate the actual anti-noise delivered. The anti-noise estimate is then subtracted from the residual to estimate the original noise.

"A"—The adaptive equalizer. This filter adapts to minimize the residual signal power.

This system achieves cancellation when the adaptive equalizer, "A", has a transfer function which is the inverse of $C_1$ (the first half of "C", including the D/A, the reconstruction filter, the anti-noise driver and the transit delay to the mike). Since "A" must be causal, this inverse function must cycle slip tonal components to achieve the correct phase.

The highest frequency that can be canceled is determined by the sample rate. Depending on the desired performance, the sampling frequency must be 4 to 6 times the highest frequency to be processed.

The sampling rate and filter length determine the number of filter weights in "A" Since these weights are LMS adapted and their adaptations interact with each other, the more complex the noise, the longer adaptation will take. Noise complexity is a function of:

The number of noise components.

The spacing between noise components (closer spacing—>higher complexity).

The closest spacing of tonal components for which a steady state solution exists is determined by the frequency resolution of the filter which is computed by dividing the sample rate by the filter length. Frequencies that are closer together than this spacing also can be canceled by continuously adapting "A" at the difference frequency between the tones. This is, of course, only possible when the overall noise complexity allows adaptation at a rate consistent with the difference frequency.

A Non Adaptive DVE (Low Cost Cancellation)

Since the solution DVE finds is a global solution, independent of the specific noise levels, frequencies and phase, there is an opportunity to develop a low cost nonadaptive version of DVE. It is appropriate when the transfer function "C" does not vary (as in open-back headsets) and the minimum noise component spacing is predictable, In this solution calibration becomes a two step operation:

Find "C"—This is a current calibrate procedure. A noise source is synthesized and passed through the external system. The result is correlated with the input to determine the "impulse response". (The frequency domain transform of this impulse response is the transfer function).

Determine "A"—Take the inverse transform of "$C_2$" divided by "C" where "$C_2$" is the known transfer function of the anti-aliasing filter associated with the A/D converter.

The Motorola 56200

Description

The Motorola 56200 Adaptive Finite Impulse Response (FIR) Filter chip is designated to do most of the processing steps in adaptive feedforward cancellation when there are no delays in the plant. It was developed to cancel echoes in speaker phones and has been applied to other applications as well (e.g. the Toshiba quiet refrigerator). It is capable of processing a 256 tap FIR filter at a sample rate of over 200 KHZ and LMS adapting the filter weights in real time if the sample rate drops to less than 19 KHZ. 56200 chips can be cascaded to provide adaptive filters of almost any length and speed. This is a cost effective means to achieve a high performance DVE system. Its only problem is that since its primary application was "in-wire", there are no provisions in the chip to do Filtered-X.

FILTERED-X

The 56200 passes the reference signal "X" through its 256 sample delay line. These delayed samples (16 bit) are multiplied by the correct weights (24 bit) and accumulated in a 40 bit adder to produce the filter output. The SAME samples are also used to calculate the LMS adaptation of the filter weights leaving no opportunity to use an equalized version of X for robust adaptation. Two solutions to providing for Filtered-X operation have been proposed.

The first solution is to use separate the adaptation calculations from the filter calculations. This straight forward solution has a cost of doubling the data memory requirement but then allows storage of both X and Filtered-X. It can also be done by using separate 56200s for each function and regularly copying the weights from the adaptive chip to the filter chip.

An alternative solution is to add a fixed equalizer at the output of the 56200 (The inverse of C similar to the solution in the low-cost approach). The filter needed for Filtered-X then becomes a fixed delay which can be implemented as an offset register between the weight update calculation times and the filter weight times they change. This has an overall lower cost than the first solution.

DESCRIPTION OF THE INVENTION

Figure 2:
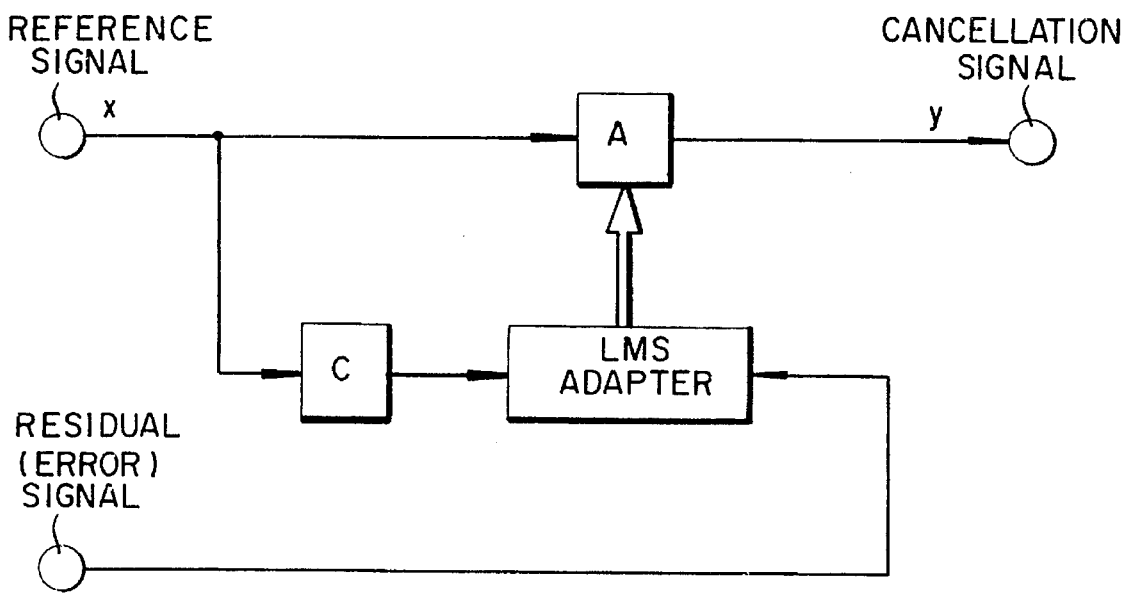
FIG. 2 is a simplified block diagram of a filtered-x adaptive canceller.

The basic adaptive filter constructs are described by Widrow. A widely applicable construct is the filtered-x method illustrated in block diagram form in FIG. 2. This method consists of a reference signal, called x, which is passed through a filter A, often an FIR or IRR filter, to produce a cancellation signal. The reference signal is further filtered by a filter C, again often an FIR filter, the impulse response of which models the phase characteristics of the external environment of the error path, sometimes referred to as the "plant". The filtering of the reference signal x led to the name "filtered-x". The output of filter C and the error output of the plant are utilized to adapt the coefficients of filter A to minimize a measure of the error, often the average power.

Figure 3:
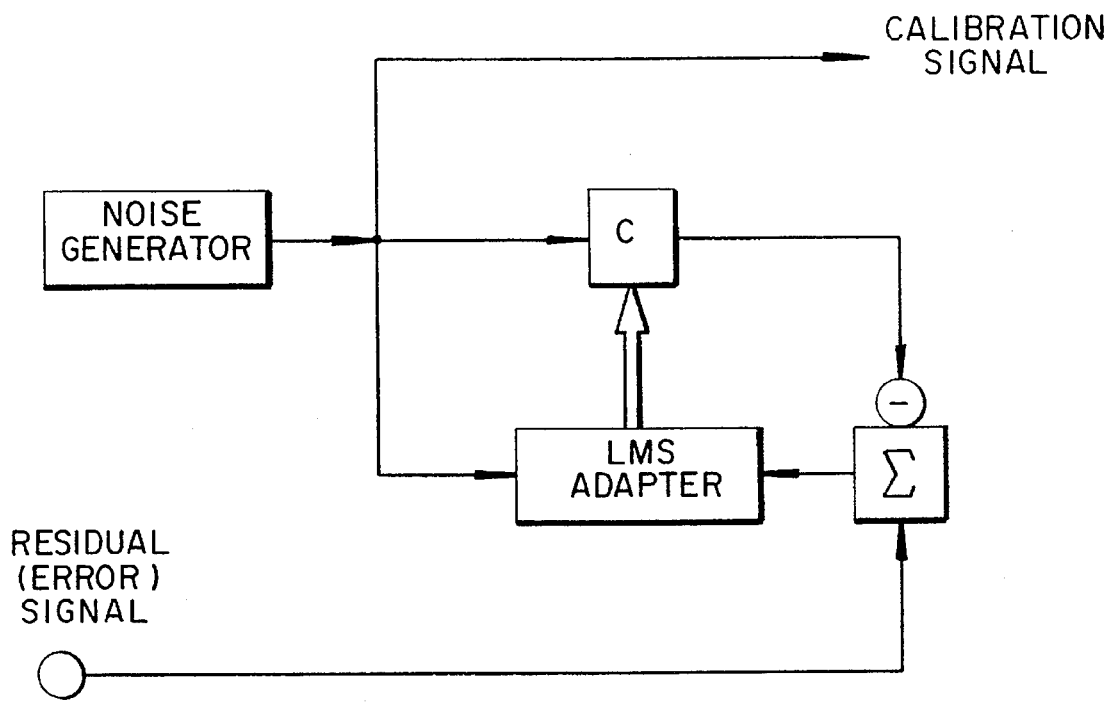
FIG. 3 is a block diagram of the method for measuring the external impulse response.

This general technique is used for system identification to measure the external impulse response, filter C, as well as to generate and adapt the cancellation signal. FIG. 3 shows a block diagram of the method for measuring the external impulse response.

Figure 4:
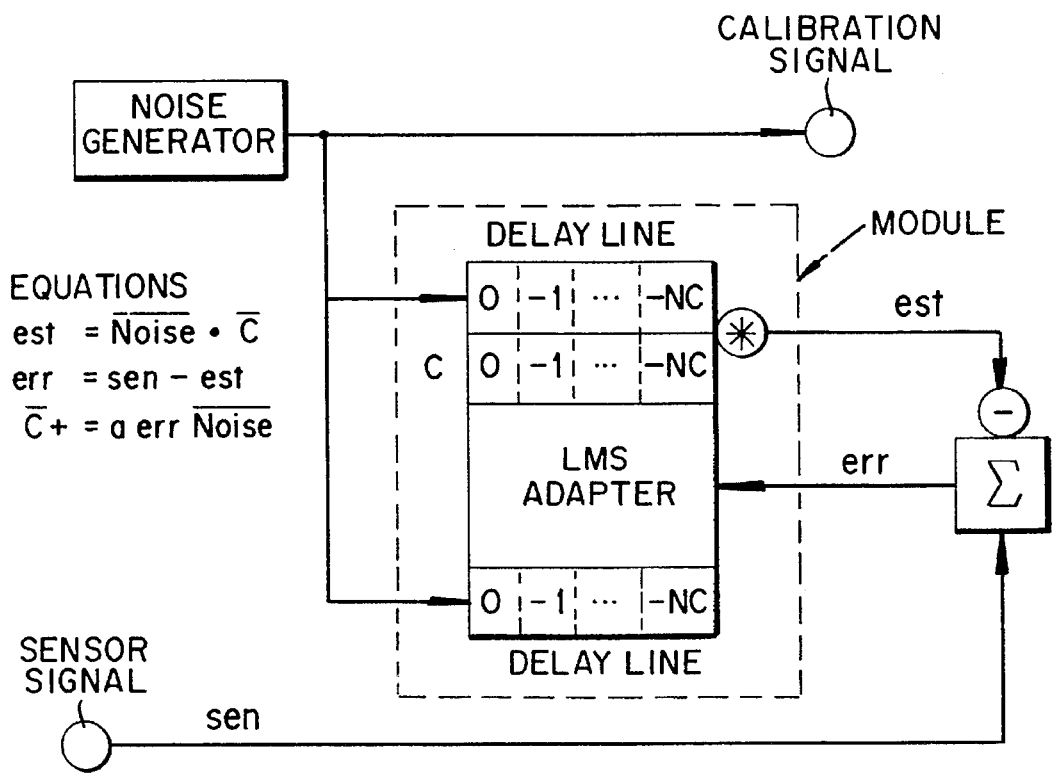
FIG. 4 shows a block diagram of the module configured so as to have the filter and adapter as a single module.

In the current invention the convolution performed by filter C and the adapter are integrated in a single module. This basic module can have wide applicability to adaptive filters and active cancellation, thus reducing the time to produce new systems and reducing cost from large scale manufacturing. FIG. 4 shows this module as configured in the system, identification operation of FIG. 3.

The invention consists of a first delay line, DL1; a vector of filter coefficients, C; an adaptor and a second delay line, DL 2. The invention operates at discrete time steps. During each step the following operations take place:

1. The contents of the first delay line are shifted one place,
2. The current input to the first delay line is placed in the initial position in delay line,
3. The current values of the filter coefficients are convolved with the first delay line producing an output value $Y_k$ at step k according to $$y_k = \sum_n DL1_n C_n$$

where
  $DL1_n$ is the n'th entry in the delay line DL1,
  $C_n$ is the n'th coefficient in C and
  n ranges over the number of entries in the delay line DL1 and the coefficients in C.

4. The contents of the second delay line are shifted one place,
5. The current input to the second delay line is placed in the initial position in the delay line,
6. The current values of the filter coefficients are adapted according to the adaptation algorithm using the current values of the filter coefficients, the contents of the second delay line and an adaptation rate item $\alpha$ to assure convergence.

In a preferred implementation an LMS algorithm is used for adaptation. The filter coefficients are then adapted according to the following:

$$C_{n,k}+1+C_{n,k}+\alpha e_k DL2_n$$

where:
  $C_{n,k}$ is the n'th coefficient being adapted at step k,
  $e_k$ is the value of the "error" input to the module at step k,
  $DL2_n$ is the n'th entry in the delay line DL2 and
  $\alpha$ is set for convergence.

In a particularly preferred implementation, $\alpha$ will be stored in a register within the module that can be updated externally.

Alternatively, the first delay line can consist of the partial sums from the convolution rather than the delayed input data, as described by INMOS in the documentation for the IMS A100. The errors introduced by this transformation when the coefficients are not constant tend to be small.

Figure 5:
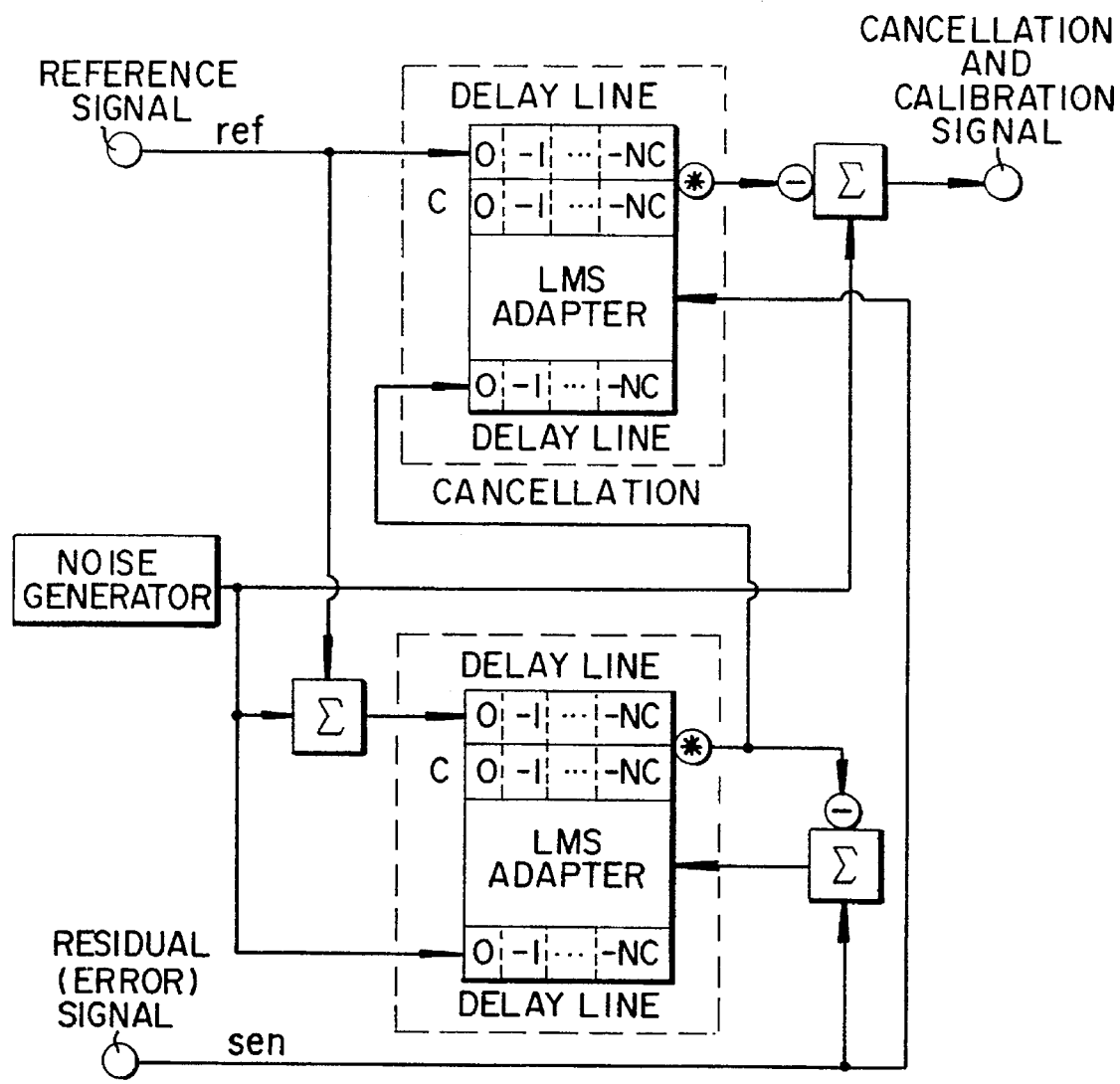
FIG. 5 is a chart of the system identification and calibration.

FIG. 5 shows the filtered-x canceller plus the system identification function configured from only two of the invention modules.

In a given manifestation of the invention a length will be selected for the delay lines and number of filter coefficients, such as 32 for example. The invention provides optional cascading of the modules to obtain longer filters when desired. The output of delay lines DL1 and DL2 can be provided to the inputs of the corresponding delay lines in successive modules. Also, cascading can be facilitated by providing a summing input to each module, the value of which is added to the convolution result. In this manner the convolution output of one stage can be added to the convolution output of the next stage to provide the effect of a longer filter.

Figure 6:
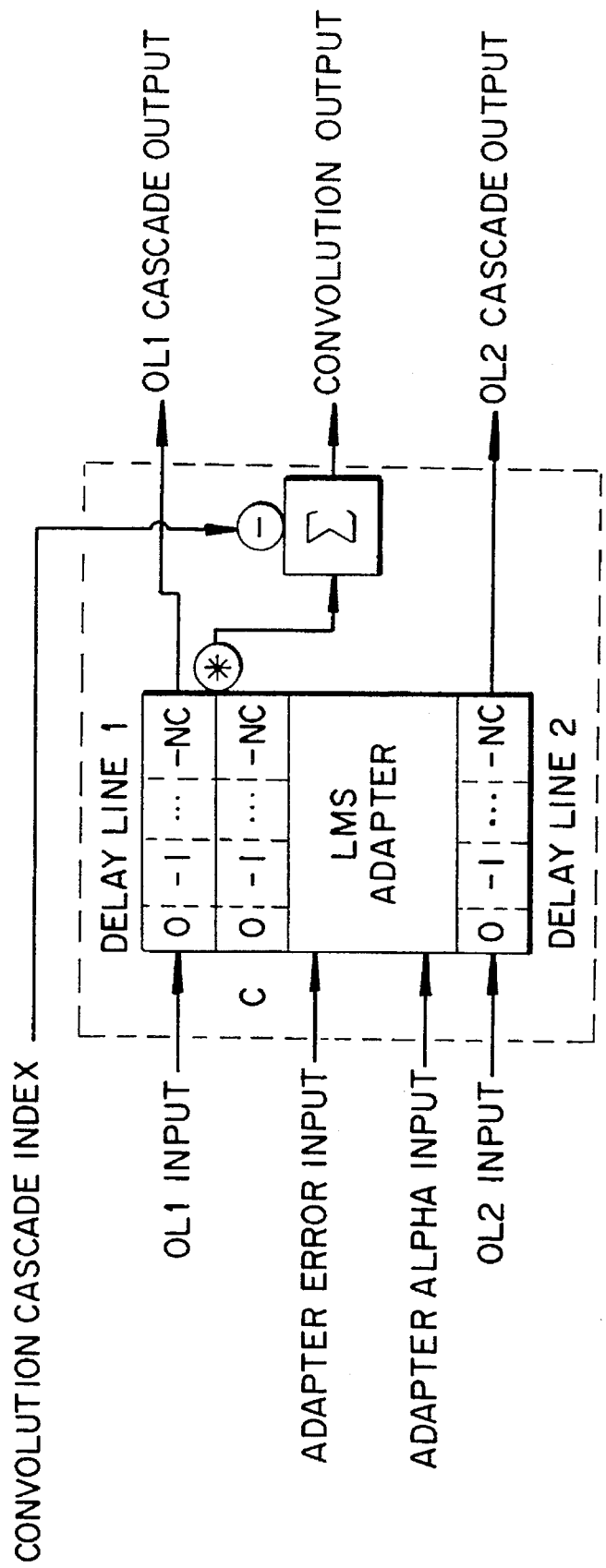
FIG. 6 is a diagram of the adaptive canceller filter module.

FIG. 6 shows a diagram of the invention including provisions for cascading multiple modules.

There are three independent numerical processes in the Filtered X LMS algorithm described. Specifically, $$W_{k+1,j} = W_{k,i} + 2\mu\epsilon X_i^b \text{ Weight Update} \quad (1)$$

$$y = \sum_i^N X_i^a W_{N-i} \text{ Convolution} \quad (2)$$

$$z = \sum_i^N X_i^b X_i^b \text{ Cross Correlation} \quad (3)$$

where $X^a$ and $X^b$ are delay line 1 and delay line 2 as described.

As can be seen this can be accomplished with only adders and multipliers. This limits the type of computational resources required to perform this task. To keep the cost reasonable one should reduce the number of the resources while maintaining reasonable throughput. Look at a simple vector pipeline to process a convolution. This can be built with one multiplier, one adder, an accumulator, and two vector register files. We can make use of the parallel nature of this computation by overlapping the multiplications and additions. A time-space diagram of the process shows that both the adder and multiplier are in use at every clock tick except the first where only the multiplier is being used.

| M | 1 | 2 | 3 | 4 | 5 | 6 |   |
|---|---|---|---|---|---|---|---|
| A |   | 1 | 2 | 3 | 4 | 5 | 6 | ...

The number in the block is essentially the index i in the summation. As you can see these resources are utilized (almost) 100% of the time. To relate this to throughput we need to find an expression for the number of clock ticks $T_n$ required to calculate a n point convolution. This is easily shown to be:

$$T_n = (n-1) + 2 = n + 1$$

The throughput is simply $$W = \frac{1}{\tau T_n} = \frac{1}{\tau(n+1)}$$

If the clock cycle $\tau$ is 100 nS then the throughput for a 32 tap filter is 303 KHZ.

We can now show that we can maintain 100 KHZ throughput for all of the equations without adding any computational resources. We will assume that the cycle time $\tau$ is 100 nS and that the expression $2\mu\epsilon$ is available without any additional processing. A time-space map of the resource utilization to complete one set of the equations (one of the multiples and accumulates for the index i) looks like

| M | A | C | B |   |   |
|---|---|---|---|---|---|
| A |   | A | C | B |   |

In this diagram, the A's are the weight updates, the B's are the convolution, and the C's are the cross-correlation. They are arranged in this way because the convolution is dependent on the result of the weight update equation. The cross-correlation calculation is used to fill the gap and maintain the full utilization of the processing resources. Clearly, these operations can be chained as we did for the convolution and the resulting throughput is $$W = \frac{1}{\tau(3n+1)}$$

and is 101 KHZ for a 32 tap filter.

The problem actually becomes more complicated if the cross-correlation is not calculated.

For this case the time-space diagram is

| M | A |   | B |   |
|---|---|---|---|---|
| A |   | A |   | B | and there are gaps in the middle. Full utilization can be maintained if delays are introduced between the issue of consecutive instructions, as below

| M | 1 | 2 | 1 | 2 | 3 | 4 | 3 | 4 | 5 | ... |
|---|---|---|---|---|---|---|---|---|---|---|
| A |   | 1 | 2 | 1 | 2 | 3 | 4 | 3 | 4 | 5 | ... |

The number indicates the ith instruction issued. The second instruction was issued one tick after the first but one must wait three clock ticks before one can issue the third instruction. In this way maximum throughput can be maintained which in this case would be 202 KHZ for a 32 tap filter.

INTERNAL ARCHITECTURE

Figure 7:
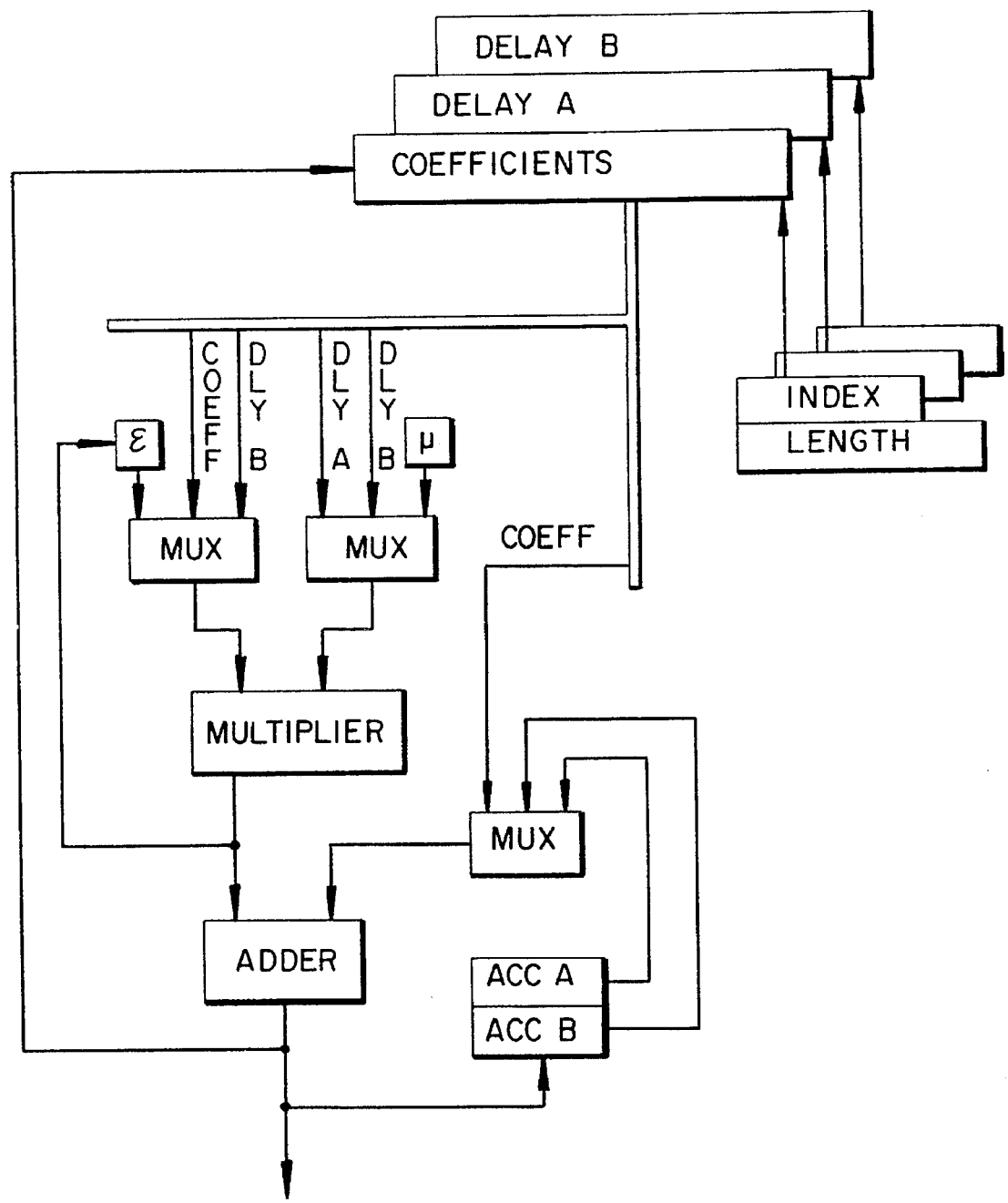
FIG. 7 is a diagram of the architecture of the filter chip.

The goal can be accomplished with only one multiplier and one adder. Three vector registers, one to hold the coefficients and the two for the delay lines are also needed. There will be an index register and a length register (one for all three) associated with each vector register to control their access. Two accumulators are necessary to handle the parallel summations of equations 2 and 3. This architecture is shown in FIG. 7 as an FIR filter system.

Note there are also two general purpose registers that are used to hold the values of $\mu$ and $\epsilon$.

VECTOR REGISTERS

Each vector register is capable of holding a vector of length M. M could be as large as 256 or larger if this is practical for the chip manufacturer. The length of the vector used at run time is controlled by the LENGTH register. This register allows modulo N indexing of the vectors where N is the length of the summation. The actual indexing is performed by an index register associated with each vector.

Each indexing unit will provide the facilities to increment (decrement) the index register. This gives the flexibility required to perform circular convolutions without actually having to shift the data through the vector register. At the beginning of an update cycle (which consists of the weight update, convolution, and cross-correlation) the index registers will point to the oldest values in the delay lines and the coefficient associated with time $\tau=0$. The first step is to write the newest data over the oldest data in the delay lines. Their index registers are then incremented so that what was the $N-1^{th}$ element in the delay line is now the $N^{th}$ as shown in the figure.

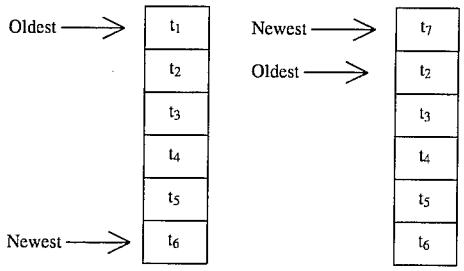

This way the delay lines are completely dynamic without the need to actually move data.

COMPUTE ENGINE

The compute engine consists of the multiplier and adder plus the supporting elements that allow the computation to take place.

Data is routed from the vector registers to the compute engine on a 72 bit bus or similar bus. This bus simultaneously carries the three 24 bit words of the coefficients and delay lines. The operands to the multiplier are provided from two multiplexers which are connected as shown in the block diagram. Note that in addition to the vector registers the multiplexer can also select two scalar registers $\mu$ and $\epsilon$. These allow the operations required for the weight update. Initially, $\mu$ is multiplied by the error $\epsilon$. The results are stored back into $\epsilon$ for future use. One of the operands for the adder comes from the multiplier. The other comes from a multiplexer and allows for each of the three equations to be performed. Either the weights can be selected to perform the weight update or one of two accumulators to accommodate the two summations.

EXTERNAL ARCHITECTURE

The external architecture of the chip is difficult to specify without the aid of an actual silicone manufacturer. There are a number of operations that must be performed.

Read the latest value for delay A
Read the latest value for delay B
Read the error $\epsilon$
Output the result of the convolution
Output the result of the cross-correlation
Write/Read the current values of the coefficients
Cascade the delay lines $X^a$ and $X^b$
Enable/Disable weight update
Accept a new value of $\mu$
Accept a value for the length of the vectors Clearly the last two can be set up as a standard microprocessor interface. Provision can be made to bootstrap appropriate values. Two pins to select from default lengths and reading a port on power-up are suitable.

Provision is also made so that multiple chips can transfer their coefficients. A chip that is being used for plant identification can broadcast its results to one or two other chips. This can be accomplished with the aid of a microprocessor or independently. In either event the possibility of serial communications should not be overlooked since it saves the cost of many pins.

The first five items on the list can be accomplished in a number of ways. A microprocessor interface is one alternative. Direct communication is another. One interesting possibility is the use of A/D and D/A converters. Sigma-delta technology is becoming more and more common in mixed mode applications. If it is possible to integrate these onto the chip in a cost effective manner then the external interfacing becomes a simple matter of summing and buffering with op-amps.

Changes and modifications will occur to those of ordinary skill in the art without departing from the scope of the following claims.

We claim:

1. An adaptive canceller filter module means for use with filtered-X algorithms in active noise cancellation systems, said module means comprising:
   a first signal sensor means to receive a reference signal;
   a first filter means adapted to produce a cancellation signal in response to said reference signal;
   a second filter means adapted to filter the reference signal produced by the first filter means, the impulse response of which models at least the phase characteristics of the external environment and produces an output signal;
   second signal sensor means to receive an error signal; and
   adaptive means using an adaptive output signal of said second filter means and said error signal to adapt the coefficients of said first filter means to minimize a measure of error.

2. An adaptive canceller filter module means as in claim 1, wherein the second filter means and adaptive means are integrated into a single unit.

3. An adaptive canceller filter module means as in claim 1, including a plant error signal generating means adapted to receive input from said signal sensor means and produce a plant error signal which is fed to said adaptive means.

4. An adaptive canceller filter module means as in claim 1, including a noise generating means adapted to produce said cancellation signal in conjunction with said first filter means.

5. An adaptive canceller filter module means as in claim 4, wherein the second filter means and the adaptive means consist of one integrated adaptive filter means.

6. An adaptive canceller filter module means as in claim 1, wherein said first filter means is a FIR filter and said second filter means is a FIR filter.

7. An adaptive canceller filter module means as in claim 6, wherein said first filter means has a vector of filter coefficients adapted to be acted upon and changed by the adaptive means output signal.

8. An adaptive canceller filter module means as in claim 7, wherein said filter means comprise an adaptive Finite Impulse Response Filter chip.

9. The method of minimizing a measure of error in an active noise cancellation system including a first delay line, a vector of filter coefficients, an adapter and a second delay line, comprising:

provenant a reference signal, shifting the contents of said first delay line one place;

placing the reference signal in the initial position in the delay line;

convoluting a current values of the filter coefficients with the first delay line to produce an output value;

shifting the contents of the second delay line one place;

placing the current input to the second delay line in the initial position thereof; and adapting the current values of the filter coefficients according to the adaption algorithm using the current values of the filter coefficients, the contents of the second delay line and an adaption rate to assure convergence.

10. A method as in claim 9, wherein convoluting the current values of the filter coefficients is performed according to the formulas:

$$y_k = \sum_n DL1_n C_n \quad (1)$$

or $$y_k = \sum_i x_i^9 W_{N-1}. \quad (2)$$

* * * * *